US007446686B2

(12) United States Patent
Rueger et al.

(10) Patent No.: US 7,446,686 B2
(45) Date of Patent: Nov. 4, 2008

(54) INCREMENTAL DELTA-SIGMA DATA CONVERTERS WITH IMPROVED STABILITY OVER WIDE INPUT VOLTAGE RANGES

(75) Inventors: Timothy Rueger, Austin, TX (US); Stephen Timothy Hodapp, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/525,435

(22) Filed: Sep. 22, 2006

(65) Prior Publication Data

US 2008/0074303 A1 Mar. 27, 2008

(51) Int. Cl.
*H03M 3/00* (2006.01)
(52) U.S. Cl. .................... 341/143; 341/155; 341/172
(58) Field of Classification Search ............. 341/143, 341/172
See application file for complete search history.

(56) References Cited

U.S. PATENT DOCUMENTS

| | | | | |
|---|---|---|---|---|
| 5,012,244 | A * | 4/1991 | Wellard et al. | 341/143 |
| 5,055,846 | A * | 10/1991 | Welland | 341/155 |
| 5,724,037 | A * | 3/1998 | Lee | 341/143 |
| 5,982,316 | A * | 11/1999 | Shin | 341/143 |
| 6,064,326 | A * | 5/2000 | Krone et al. | 341/143 |
| 6,362,763 | B1 * | 3/2002 | Wang | 341/143 |
| 6,556,159 | B1 * | 4/2003 | Fei et al. | 341/143 |
| 6,570,519 | B1 * | 5/2003 | Yang | 341/143 |
| 6,765,520 | B1 * | 7/2004 | Chuang et al. | 341/143 |
| 6,768,436 | B1 * | 7/2004 | Chuang | 341/143 |
| 6,795,006 | B1 * | 9/2004 | Delight et al. | 341/143 |

OTHER PUBLICATIONS

Robert et al., A Second-Order High-Resolution Incremental A/D Converter With Offset and Charge Injection Compensation, IEEE JSSC, vol. 23, No. 3, Jun. 1988, pp. 736-741.
Quiquempoix et al., A Low-Power 22-bit Incremental ACD with 4 ppm INL, 2 ppm gain Gain Error and 2 uV DC Offset, Proc. of ESSCIRC, 2005, pp. 443-446.
Pertijs, et al., A CMOS Smart Temperature Sensors With a 3s Inaccuracy of +/-0.1 C From—55C to 125C, IEEE JSSC, vol. 40, No. 12, Dec. 2005, pp. 2805-2815.

(Continued)

Primary Examiner—Khai M Nguyen
(74) Attorney, Agent, or Firm—Thompson & Knight LLP; James J. Murphy

(57) ABSTRACT

A method of operating a delta-sigma data converter includes receiving an input signal at an input of a delta-sigma modulator having a loop filter including a plurality of integrator stages, a quantizer for generating a quantized output code from outputs of the integrator stages, and a feed-back loop coupling a feed-back signal from the output of the quantizer to the input of the delta-sigma modulator. The input signal is converted to quantized output codes during a conversion period including a plurality of integrator cycles in which at least one of the integrator stages is held in reset for at least one integration cycle at the start of the conversion period to maintain stability of the modulator over a wider range of levels of the input signal.

20 Claims, 6 Drawing Sheets

OTHER PUBLICATIONS

Mulliken et al., Delta-Sigma Algorithmic Analog-to-Digital Conversion, undated, 4 pages.

Kavusi et al., On Incremental Sigma-Delta Modulation with Optimal Filtering, IEEE Trans. On Circuits and Systems, 2005, 16 pages.

Markus J. et al., "Theory and Applications of Incremental Delta Sigma Converters", IEEE Transactions on circuits and Systems I: Fundamental Theory and Applications, IEEE Inc., vol. 51, No. 4, Apr. 2004, pp. 678-690.

* cited by examiner

INCREMENTAL DELTA-SIGMA DATA CONVERTERS WITH IMPROVED STABILITY OVER WIDE INPUT VOLTAGE RANGES

FIELD OF INVENTION

The present invention relates in general to delta-sigma data converters techniques, and in particular, to incremental delta-sigma data converters with improved stability over wide input voltage ranges.

BACKGROUND OF INVENTION

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, a low-pass delta-sigma modulator performs noise shaping by acting as a lowpass filter to the input signal and a highpass filter to the noise; most of the quantization noise power is thereby shifted out of the signal band.

The typical delta-sigma modulator ADC includes a summer that sums the input signal with negative feed-back, a linear filter, a quantizer, and a feed-back loop with a digital to analog converter coupling the quantizer output and an inverting input of the summer. In a first order modulator, the linear filter comprises a single integrator stage while the filter in a higher order modulator comprises a cascade of a corresponding number of integrator stages. The quantizer can be either a one-bit or a multiple-bit quantizer. Higher-order modulators have improved quantization noise transfer characteristics over those of a lower order, but stability becomes a more critical design factor as the order increases.

In particular, higher order delta-sigma modulators implement multiple sets of poles and zeros that advantageously provide for improved noise shaping and consequently an increased signal to noise ratio (SNR) in the signal base band. However, high order delta-sigma modulators with aggressive noise transfer functions (NTF's) (i.e. NTF's that provide high out-of-band gain) are also subject to instability for large input signals. Generally, in order to avoid instability with higher order delta-sigma modulators, it becomes important to maintain the input voltage range within given limits in order to ensure that the loop filter integrator stages do not saturate and/or that the quantizer does not overload. Additionally, stability can be ensured by decreasing the out-of-band gain of the NTF. Disadvantageously, reducing the input voltage range limits the dynamic range of the delta-sigma modulator, while reducing the NTF out-of-band gain reduces the SNR.

In sum, new techniques are desirable for designing and constructing high order delta-sigma modulators having NTF's with high out-of-band gain and a maximum dynamic input voltage range.

SUMMARY OF INVENTION

The principles of the present invention are embodied in incremental delta-sigma data conversion techniques that provide modulator stability over a wider input voltage range. According to one representative embodiment, a method of operating a delta-sigma data converter is disclosed that includes receiving an input signal at an input of a delta-sigma modulator having a loop filter including a plurality of integrator stages, a quantizer for generating a quantized output code from outputs of the integrator stages, and a feed-back loop coupling feed-back from the output of the quantizer to the input of the delta-sigma modulator. The input signal is converted to quantized output codes during a conversion period including a plurality of integrator cycles in which at least one of the integrator stages is held in reset for at least one integration cycle at the start of the conversion period to maintain stability of the modulator over a wider range of levels of the input signal.

Embodiments of the present principles advantageously allow a delta-sigma data converter to operate in an incremental conversion mode while remaining stable over a wider range of input voltages. In one exemplary technique, the integrator stages of a delta-sigma converter are sequentially released from reset at the start of each conversion cycle to sequentially increase the order of the modulator. As a result, the delta-sigma modulator is maintained in stability while a full aggressive noise transfer function is gradually implemented. In another technique, all the integrator stages of a delta-sigma converter are initially held in reset for at least one integration period at the start of each conversion period. While the integrator stages are in reset, a feed-forward stage ensures that feedback is generated through the converter quantizer and feedback loop, such that the first integrator stage in the cascade remains stable when all the integrator stages are simultaneously released from reset to begin noise shaping.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-6 of the drawings, in which like numbers designate like parts.

Figure 1:
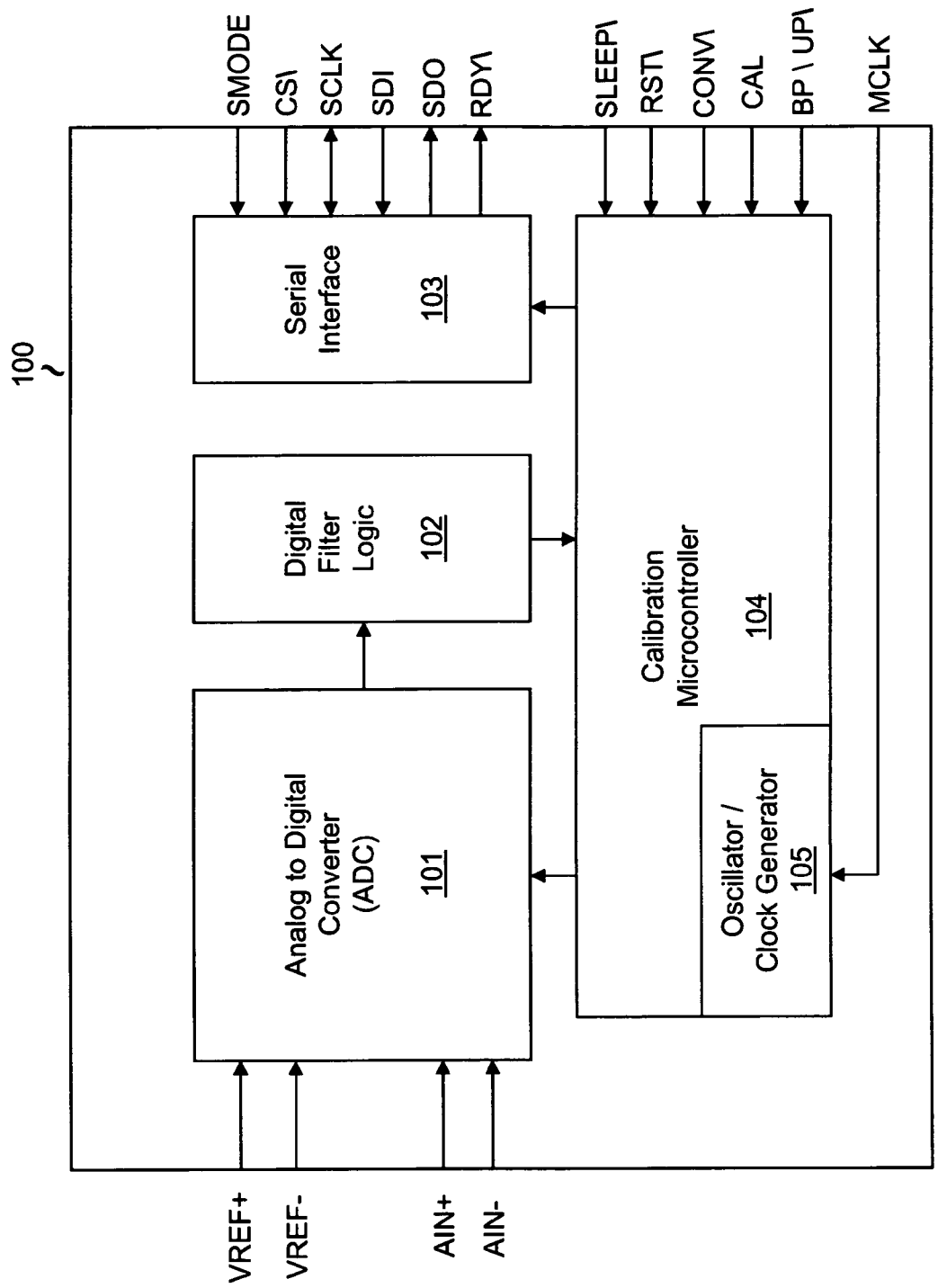
FIG. 1 is a high level block diagram of a representative analog to digital conversion system suitable for describing the inventive principles.

FIG. 1 is a high level block diagram of an analog to digital converter system 100 suitable for demonstrating the principles of the present invention. System 100 includes an analog to digital converter (ADC) 101, which will be discussed further below. Generally, ADC 101 converts into digital form a fully differential analog input signal composed of the analog voltages AIN+ and AIN− utilizing the reference voltages VREF+ and VREF−.

The digital output from ADC 101 is provided to digital filter logic 102 which includes, in the illustrated embodiment, a 160-tap finite impulse response (FIR) filter which, in the incremental mode discussed below, acts both as a filter and as an accumulator. Control signals are input and output from system 100 through serial interface 103. A calibration microcontroller 104 supports self-calibration of system 100 to minimize offset and gain errors.

Oscillator/clock generator block 105 generates the internal clock and control signals discussed below in response to the master clock (MCLK) signal. Serial digital data is output through the serial data output (SDO) port timed by the serial clock (SCLK) signal. The serial mode control signal (SMODE) sets serial interface 103 into either a slave mode or a master mode. In the master mode, system 100 generates the SCLK signal, which is output along with the serial output data. In the slave mode, the SCLK signal is received from external logic or an external microcontroller through the SCLK pin.

The chip select pin cs\ allows an external device to access the SDO port. In particular, when the cs\ input is set to an inactive high state, the SDO output is held in a high impedance output state. The ready (RDY\) input operates in conjunction with the convert (CONV\) input pin to microcontroller 104. Specifically, the RDY\ signal transitions to a logic high state when calibration is initiated. When the calibration process is near completion, the state of the CONV\ signal is determined. If the CONV\ signal is in a logic high state, the RDY\ signal falls upon completion of calibration; however, if the CONV\ signal is low, ADC 100 immediately starts the conversion of the input signals AIN+ and AIN− and the RDY\ signal remains in a logic high state until the conversion is completed. At the end of any conversion, the RDY\ signal transitions to a logic low state to indicate that a conversion word is available for access through serial interface 103. The RDY\ signal returns high after all the data bits of the conversion word are shifted out of the SDO output or two cycles of the MCLK signal before new data becomes available, if the cs\ pin is in an inactive (logic high) state. Alternatively, the RDY\ signal returns to a logic high state before 2 MCLK signal cycles of new data becomes available if the cs\ pin is held low, and the data have not started to be read from the converter in the slave mode.

The SLEEP\ input to calibration microcontroller 104 causes system 100 to enter a low power state by halting the internal oscillator and a powering down all on-chip analog circuitry. The reset (RST\) pin is utilized on power-up of system 100 and resets digital logic in system 100 and activates certain on-chip analog circuitry. The calibrate (CAL) pin generally allows system 100 to be calibrated at any desired time. Finally, the BP/UP\ signal controls the analog input AIN+ and AIN−. In the bipolar mode, the inputs AIN+ and AIN−, for example, span an analog input range of −4.096 volts to +4.096 volts fully differential, for a voltage reference of 4.096 volts. In the unipolar mode, the input span presented at the analog inputs AIN+ and AIN− is, for example, 4.096 volts fully differential. The BP/UP\ pin also sets the output data format. In particular, in the bipolar mode the output data is coded in two's complement format and in the unipolar mode the output data is coded in binary format.

Figure 2:
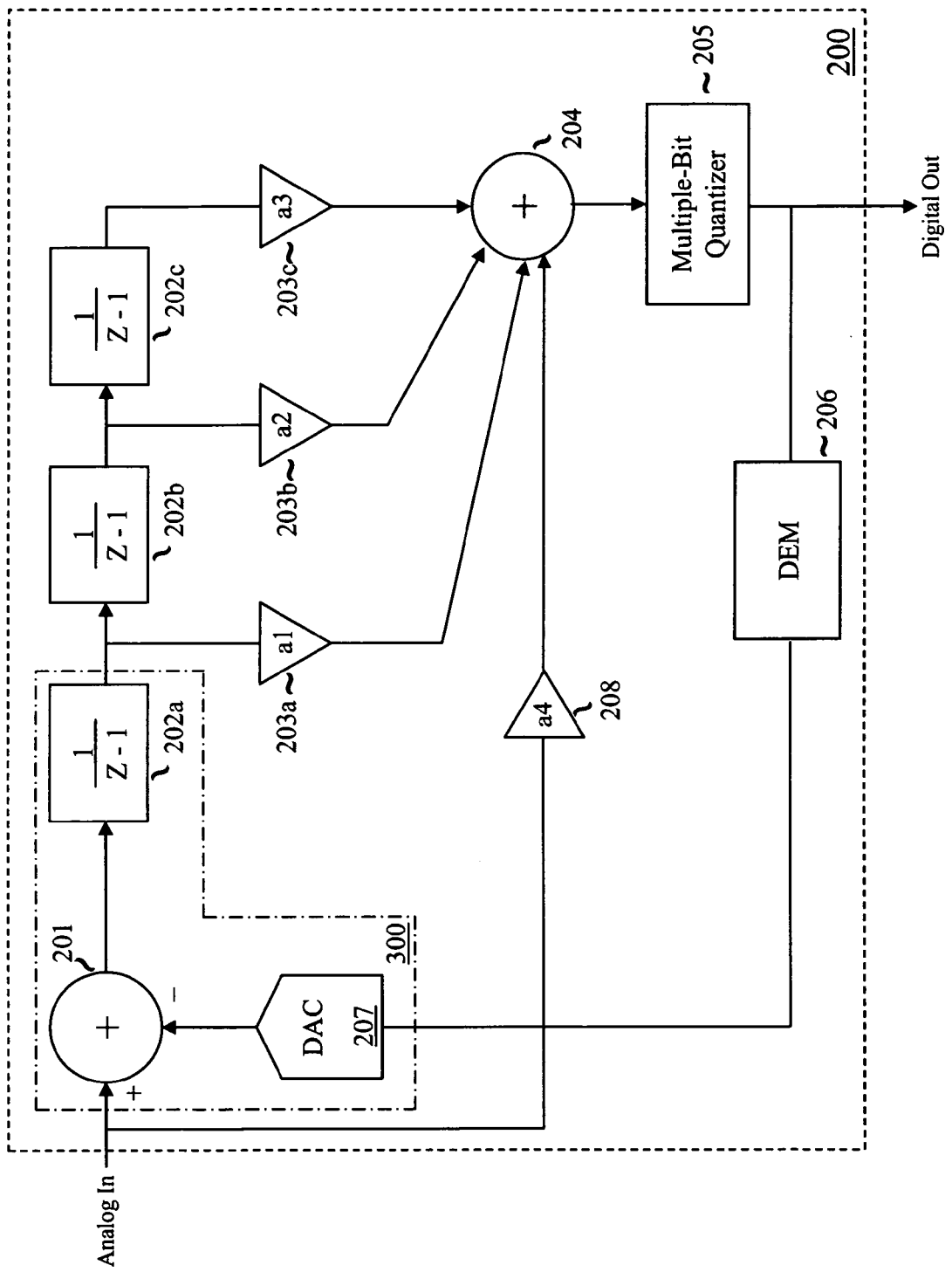
FIG. 2 is a high level block diagram of a third order feed-forward delta-sigma modulator suitable for utilization in the analog to digital converter of FIG. 1.

FIG. 2 is an exemplary 3rd order incremental delta-sigma modulator 200 comprising an input summer 201 and three (3) integrator stages 202a-202c. As discussed in further detail below, delta-sigma modulator 200 operates in an incremental mode during conversion of an analog input signal ANALOG IN into multiple-bit digital form.

Delta-sigma modulator 200 is a weighted feed-forward design in which the outputs of each of the integrator stages are passed through a gain stage (amplifier) 203a-203c to an output summer 204. Amplifiers 203a-203c allow the outputs of the integrator stages to be weighted at the summer 204 input. The output from summer 204 is quantized by a multiple-bit quantizer 205, which generates the multiple-bit digital output signal (DIGITAL OUT). Additionally, the output from quantizer 205 is fed-back to the inverting (−) input of input summer 201 through dynamic element matching (DEM) circuitry 206 and multiple-bit digital to analog converter (DAC) 207. A direct weighted feedforward path 208 provides an analog signal directly from the modulator input, to summer 204. (A 3rd order feed-forward delta-sigma modulator design was selected for discussion purposes; in actual implementation; the order as well as the configuration of delta-sigma modulator 200 may vary. A general discussion of delta-sigma modulator topologies can be found in the literature, for example, in Norsworthy et al., *Delta-Sigma Data Converters, Theory, Design and Simulation*, IEEE Press, 1996).

In incremental delta-sigma modulator 200, the input signal is sampled, filtered, and quantized during N number of integration cycles making up each conversion period. At the end of each conversion period, the accumulated data within a decimation filter within digital filter logic 101 is output, and integrator stages 202a-202c are reset. Generally, during reset, the output of each integrator stage 202a-202c is held at zero and the internal integration capacitors are shorted to clear the stored charges, as discussed further below.

In the illustrated embodiment, each integration cycle is composed of the two-phases, $\phi_1$ and $\phi_2$, per MCLK signal period, as discussed below in conjunction with FIG. 3. In the illustrated exemplary embodiment of delta-sigma modulator 200, the MCLK clock signal has a frequency of 8 MHz, and each conversion period is twenty (20) microseconds in length or one hundred and sixty (160) integration phases. The resulting output word rate is fifty (50) kilo-samples per second (ksps).

One advantage of incremental delta-sigma modulator 200 is a shorter latency of one-half (½) the baseband sample period through the following decimation filter. Specifically, for a symmetric decimation filter having an impulse response of one conversion period, the latency will be one-half (½) of an output sample conversion period, rather than the typical tens of sample periods in a conventional delta-sigma ADC. For example, if the impulse response of the decimation filter is 160 periods of the 8 MHz MCLK signal, and a decimated output is generated every 20 microseconds, for a 50 ksps output word rate, for a symmetric decimation impulse response, the group delay is 80 periods of the MCLK signal, or equivalently, a ½ baseband sample period of only 10 us. Hence, an incremental delta-sigma modulator allows for single conversions to be performed, similar to successive approximation register (SAR) converters, except with the low-level linearity of a delta-sigma modulator.

Additionally, incremental delta-sigma modulator 200 enables data converter 100 to be utilized in multiplexed applications, which conventional delta-sigma converter normally cannot support due to the long impulse response of the decimation filter. In particular, since the accumulated data in following decimation filter within digital filter logic 101 only remains for one conversion period, the analog input source can be switched without data from the two different sources being shifted into the filter at the same time. This feature is not supported by conventional delta-sigma ADCs, which typically utilize digital filters with impulse responses much longer than the conversion period.

However, with higher order incremental delta-sigma modulators, particularly those having aggressive NTFs, instability can result when a high level input signal is present at reset before the start of each new conversion period. Specifically, at reset, the input to the delta-sigma modulator is subjected to a full-scale step input with a full scale input signal. For a conventional incremental delta-sigma modulator, the feed-back to the input summer is necessarily zero at the start of each new conversion period, due to reset of the quantizer and feedback DAC at the end of the previous conversion period. For high values of the input signal, and with the feed-back being zero, the signal appearing at the summing nodes of the first integrator stage can approach one half (½) the full scale input value during the first integration cycle, thereby driving the first integrator stage into saturation. In turn, the following integrator stages and the quantizer can overload, such that the entire delta-sigma loop becomes unstable. In conventional delta-sigma modulators, the entire delta-sigma modulator must typically be reset to return the delta-sigma loop to a stable state.

Figure 3:
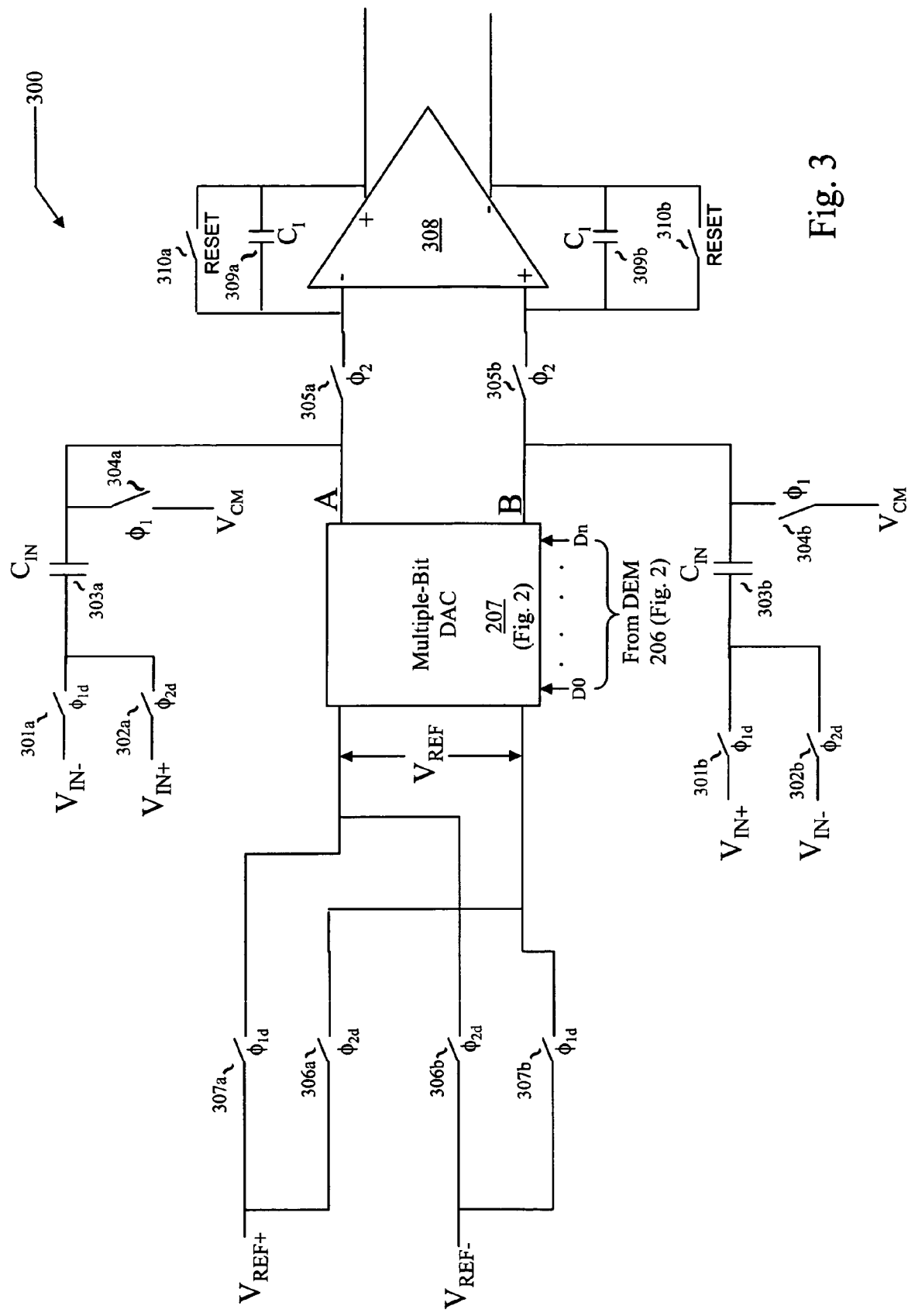
FIG. 3 is an electrical schematic diagram of representative switched-capacitor circuitry suitable for use in the input summer, feed-back DAC, and first integrator stage of FIG. 2.

FIG. 3 is an electrical schematic diagram of an integral switched-capacitor summer—DAC integrator circuit 300 corresponding to first integrator stage 202a, summer 204 and DAC 207 of delta-sigma modulator 200. The integrator portion of first integrator stage 202a, including the sampling and integration capacitors, the operational amplifier, and associated switches discussed below, is similar to the integrator circuitry found in second and third integrator stages 202b and 202c.

Figure 4:
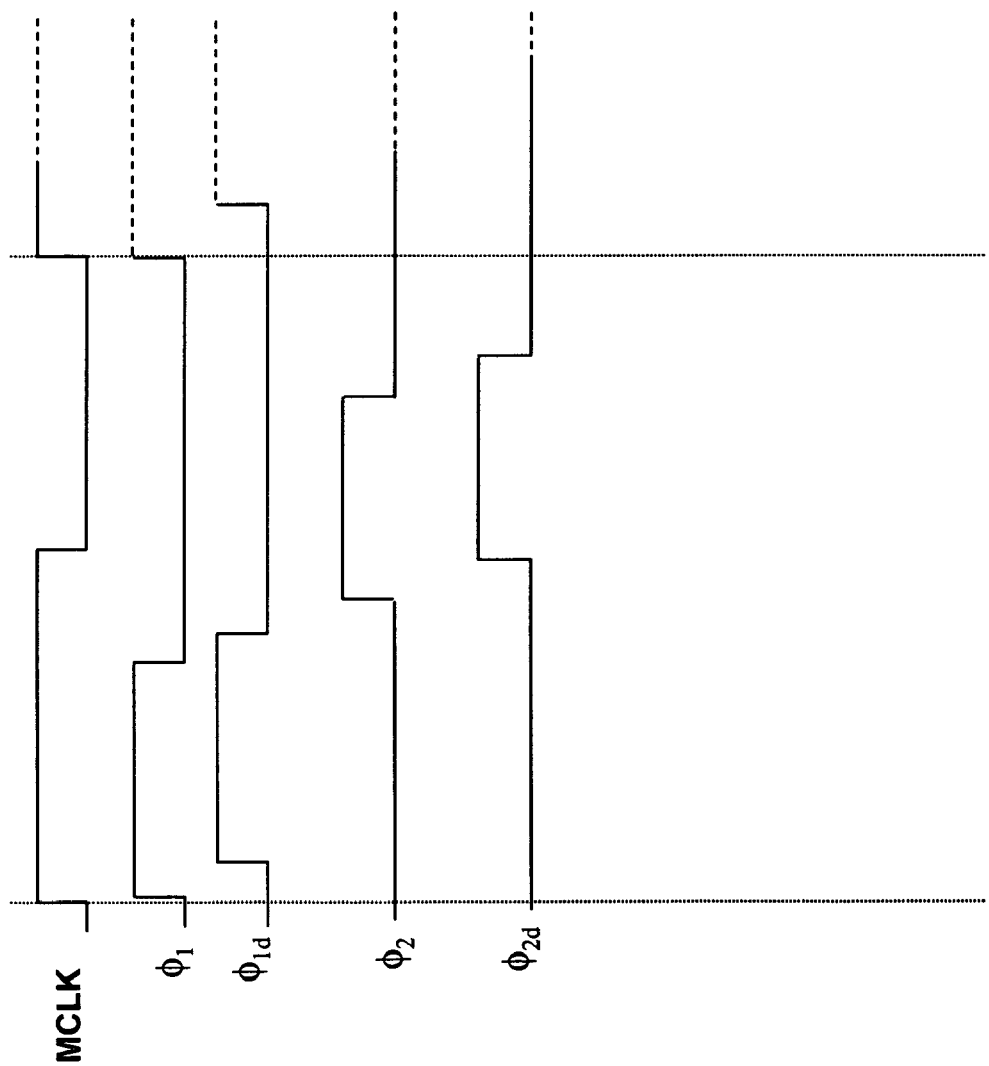
FIG. 4 is a timing diagram describing the operation of the switched-capacitor circuitry of FIG. 3.

Switched capacitor integrator 300 generally operates in two non-overlapping Phases $\phi_1$ and $\phi_2$ per MCLK signal period. The timing of Phases $\phi_1$ and $\phi_2$ is shown in FIG. 4. Delayed Phases $\phi_{1d}$ and $\phi_{2d}$ are delayed versions of Phases $\phi_1$ and $\phi_2$. In the illustrated embodiment, a double sampling technique is utilized to sample the input signal $V_{IN}$ and/or the reference signal $V_{REF}$. Generally, for double sampling, the input plate of each sampling capacitor is coupled to either $V_{IN}$ or $V_{REF}$ during $\phi_1$ sampling, to implement sampling with a given polarity. During $\phi_2$ integration, the charge on each sampling capacitor input plate is then forced to the corresponding opposite plate by reversing the polarity of the voltage at that input plate.

In the general case, switches 304a-304b close during Phase $\phi_1$. During Delayed Phase $\phi_{1d}$, switches 301a-301b close and the differential input voltage $V_{IN}$ is sampled onto input sampling capacitors ($C_{IN}$) 303a-303b. Switches 302a-302b and 305a-305b are open during Phase $\phi_1$. Also, during Phase $\phi_1$, the differential reference signal $V_{REF}$ is sampled by switches 307a-307b onto reference sampling capacitors within DAC 207 of FIG. 2, under the control of complementary bits Dx and /Dx, received from quantizer 205 and DEM circuitry 206 of FIG. 2. Switches 306a-306b are open during Phase $\phi_1$.

During Phase $\phi_2$, the sampling switches reverse their configuration, with switches 302a-302b closing and switches 301a-301b and 304a-304b opening for the input signal path. For the reference path, switches 307a-307b open and switches 306a-306b close. The charges on the input plates of capacitors $C_{IN}$, and the reference capacitors within DAC 207, are forced to the charge sharing nodes A and B. During Delayed Phase $\phi_{2d}$, switches 305a-305b close to transfer the charge at common nodes A and B to the summing nodes at the inverting (−) and non-inverting (+) inputs of opamp 308 and integrator capacitors ($C_I$) 309a-309b.

In the illustrated embodiment, control signals Dx and /Dx are set in the short period between the end of Phase $\phi_2$ and the start of the current Phase $\phi_1$, as shown in FIG. 4. This timing allows the Dx and /Dx signals to propagate from the outputs of quantizer and through DEM circuitry 206 to DAC before the rising edge of Phase $\phi_1$ of the current cycle.

During incremental conversions, at the end of each integration cycle, integration capacitors 309a-309b (FIG. 3) of each integration stage 202a-202c (FIG. 2) remain in their current charging state while the current output code generated by quantizer 205 is accumulated with previously generated output codes in digital filter logic 102 (FIG. 1). At the end of the conversion period, the final output code is transferred from digital filter logic 102 for further processing, and integration capacitors 309a-309b of integration stages 202a-202c are reset by switches 310a-310b. During reset, the control signal RESET is asserted to close switches 310a-310b, which shorts the inputs and outputs of opamp 308 and dissipates the charges on integration capacitors 309a-309b. Consequently, the outputs of integrator stage 300 are forced to zero (0) volts.

Figure 5:
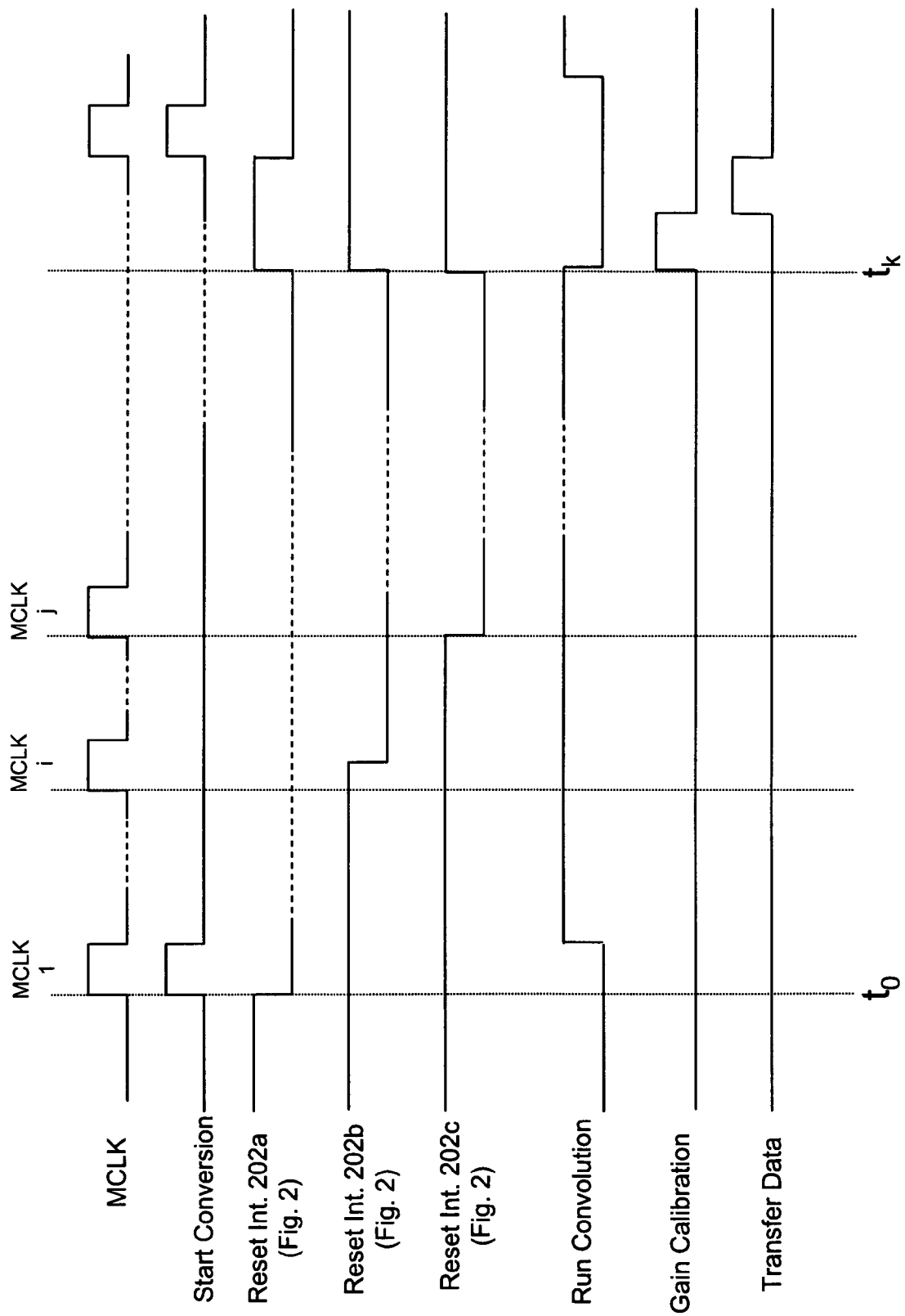
FIG. 5 is a timing diagram illustrating a first technique for operating the delta-sigma modulator of FIG. 2 according to the present inventive principles.

FIG. 5 is a timing diagram illustrating a first technique of operating delta-sigma modulator 200 of FIG. 2 according to the principles of the present invention. Generally, in the method of FIG. 5, modulator 200 begins each conversion period as a first order modulator, since first order modulators are stable. After a selected number of integration cycles, the modulator order increases to two (2), and subsequent to a selected number of integration cycles after that, the modulator order increases to three (3). Once the modulator order has reached three (3), delta-sigma modulator 200 is stable and the full NTF characteristics are achieved.

In particular, at time $t_0$, the current conversion cycle begins and first integrator stage 202a is taken out of reset. At this point, the input to quantizer 205 is being supplied from integrator stage 202a through amplifier 203a and the direct feedforward path through amplifier 208. In the illustrated embodiment, during the period when only first integrator stage 202a is active (i.e. delta-sigma modulator 200 is operating as a first order modulator), quantizer output codes begin to be accumulated within digital filter logic 101 of FIG. 1, as indicated by the low to high transition of the RUN CONVOLUTION trace of FIG. 5. In the illustrated embodiment, even though delta-sigma modulator 200 is operating as a first order modulator, the first few taps of the decimation FIR filter within digital filter logic 101 of FIG. 1 typically have very small weights, such that the overall accuracy of delta-sigma modulator 200 is not affected.

After i number of integration cycles (i.e. MCLK signal periods), in which i is an integer, second integrator stage 202b of FIG. 2 is taken out of reset such that delta-sigma modulator 200 now operates as a second order modulator. Finally, after j number of integration cycles, third integrator stage 202c of FIG. 2 is taken out of reset such that delta-sigma modulator 200 operates as a full third order modulator and provides the corresponding full aggressive NTF characteristics.

The analog input signal continues to be sampled and converted until the desired number of integration cycles have been completed at time $t_k$. At this time, all three integrator stages 202a-202c are reset. Calibration microcontroller 104 of FIG. 1 then performs gain calibration on the data accumulated in digital filter logic 102, after which the final data for the conversion period data are transferred to serial interface 103 to be shifted out through the SDO output.

Figure 6:
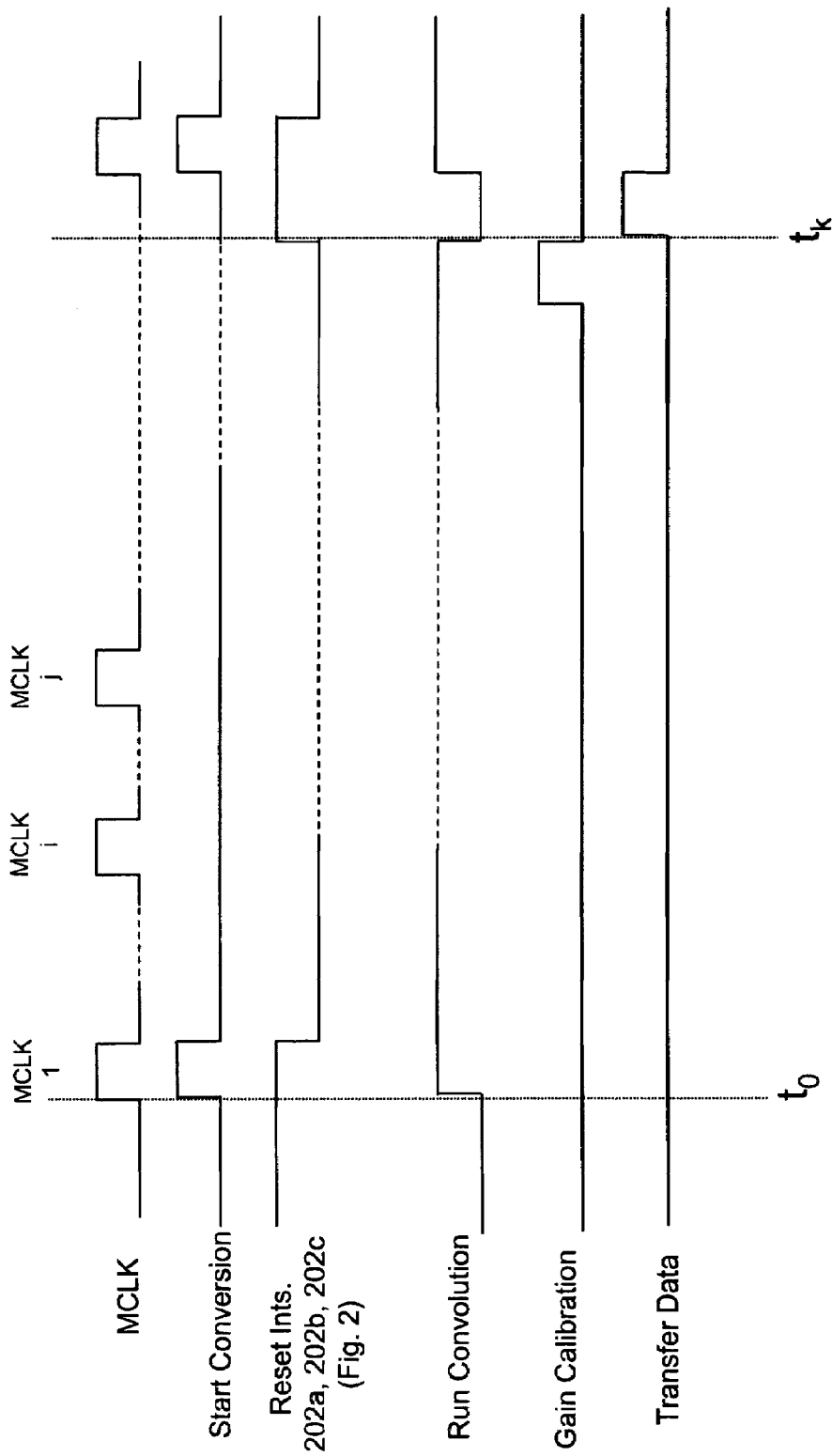
FIG. 6 is a timing diagram illustrating a second technique for operating the delta-sigma modulator of FIG. 2 according to the present inventive principles.

FIG. 6 illustrates a second technique of operating delta-sigma modulator 200 of FIG. 2 according to the principles of the present invention. In the embodiment of FIG. 6, when the conversion period starts at time $t_0$, all three integrator stages 202a-202c are simultaneously reset. At the same time, direct feedforward path 208 of FIG. 2 provides a signal to the input of multi-bit quantizer 205, which in turn provides feed-back through DEM 206 and DAC 207 to input summer 201. Consequently, when integrator stages 202a-202e are taken out of reset, in this embodiment after only one integration period, sufficient feed-back is available at summer 201 to maintain the stability of delta-sigma modulator 200. Additionally, in the embodiment of FIG. 6, the convolution (conversion) of data begins at the start of the conversion, with data accumulating in the filter of digital filter logic 102 of FIG. 1. With non-zero feedback established, at most, one half of a least significant bit (LSB) of quantizer error is injected into first integrator stage 202a after exit from reset.

In sum, the principles of the present invention allow a delta-sigma converter to operate in an incremental conversion mode and remain stable over a wider range of input voltages. In one technique, the integrator stages of an incremental delta-sigma converter are sequentially released from reset at the start of each conversion cycle to sequentially increase the order of the modulator. As a result, the delta-sigma modulator remains stable while a full aggressive NTF is gradually implemented. In a second technique, all integrators are initially held in reset for at least one integration period at the start of each conversion period. While the integrator stages are in reset, a feedforward stage ensures that feedback is generated through the delta-sigma modulator quantizer and feedback loop, such that the first integrator in the cascade remains stable when all the integrator stages are simultaneously released from reset such that noise shaping can begin.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A method of operating a delta-sigma data converter comprising:
   receiving an input signal at an input of a delta-sigma modulator having a loop filter including a plurality of integrator stages, a quantizer for generating a quantized output code from outputs of the integrator stages, and a feed-back loop coupling a feed-back signal from the output of the quantizer to the input of the delta-sigma modulator; and
   converting the input signal to quantized output codes during a conversion period including a plurality of integrator cycles comprising:
      holding each of the plurality of the integrator stages in reset for at least one integration cycle at the start of the conversion period to maintain stability of the modulator over a wider range of levels of the input signal; and
      sequentially releasing each of the plurality of integrator stages from reset over a selected number of integration cycles to sequentially increase the order of the delta-sigma modulator at the start of the conversion period.

2. The method of claim 1, wherein the input signal comprises an analog signal.

3. The method of claim 1, further comprising accumulating output codes generated by the quantizer over a plurality of integration cycles after at least one integrator stage has been released from reset.

4. The method of claim 1, wherein each integration cycle is composed of first and second timing phases.

5. The method of claim 4, further comprising generating the feed-back signal with the quantizer and the feed-back loop for a current integration phase during the second timing phase of the preceding integration cycle.

6. A method of operating a delta-sigma data converter comprising:
   receiving an input signal at an input of a delta-sigma modulator having a loop filter including a plurality of integrator stages, a quantizer for generating a quantized output code from outputs of the integrator stages, and a feed-back loop coupling a feed-back signal from the output of the quantizer to the input of the delta-sigma modulator; and
   converting the input signal to quantized output codes during a conversion period including a plurality of integrator cycles comprising:
      holding at least a first one of the integrator stages in reset for at least one integration cycle at the start of the conversion period to maintain stability of the modulator over a wider range of levels of the input signal; and
      feeding-forward a signal directly from the input of the delta-sigma modulator to the quantizer to generate the feed-back signal while the first one of the integrator stages is in reset.

7. The method of claim 6, wherein maintaining at least one of the integrator stages in reset for at least one integration cycle comprises maintaining each of the plurality of integrator stages in reset for at least one integration cycle.

8. The method of claim 7, further comprising sequentially releasing each of the integrator stages from reset over a selected number of integration cycles to sequentially increase the order of the delta-sigma modulator at the start of the conversion period.

9. A delta-sigma data converter comprising:
   an input for receiving an input signal;
   a loop filter including a plurality of integrator stages;
   a quantizer for generating a quantized output code from outputs of the integrator stages;
   a feed-back loop coupling a feed-back signal from the output of the quantizer to the input of the delta-sigma modulator; and
   timing and control circuitry for converting the input signal to quantized output codes during a conversion period including a plurality of integrator cycles, wherein the timing and control circuitry:
      holds each of the integrator stages in reset for at least one integration cycle at the start of the conversion period to maintain stability of the modulator over a wider range of levels of the input signal; and
      sequentially releases each of the integrator stages from reset over a selected number of integration cycles to sequentially increase the order of the delta-sigma modulator at the start of the conversion period.

10. The delta-sigma data converter of claim 9, wherein the timing and control circuitry maintains each of the plurality of integrator stages in reset for at least one integration cycle.

11. The delta-sigma data converter of claim 10, wherein the timing and control circuitry is further operable to sequentially release of the integrator stages from reset over a selected number of integration cycles to sequentially increase the order of the delta-sigma modulator at the start of the conversion period.

12. The delta-sigma data converter of claim 9, further comprising an accumulator for accumulating output codes generated by the quantizer over a plurality of integration cycles after at least one integrator stage has been released from reset.

13. The delta-sigma data converter of claim 9, wherein each of the integrator stages comprises a switched-capacitor integrator stage operating in first and second timing phases.

14. The delta-sigma data converter of claim 13, wherein the quantizer and the feed-back loop generate the feed-back signal for a current integration phase during the second timing phase of a preceding integration phase.

15. A delta-sigma data converter comprising:
an input for receiving an input signal;
a loop filter including a plurality of integrator stages;
a quantizer for generating a quantized output code from outputs of the integrator stages;
a feed-back loop coupling a feed-back signal from the output of the quantizer to the input of the delta-sigma modulator;
timing and control circuitry for converting the input signal to quantized output codes during a conversion period including a plurality of integrator cycles, wherein the timing and control circuit holds at least one of the integrator stages in reset for at least one integration cycle at the start of the conversion period to maintain stability of the modulator over a wider range of levels of the input signal; and
a direct feed-forward path from the input of the delta-sigma modulator to the quantizer for generating the feed-back signal with the quantizer when a first one of the integrator stages is in reset.

16. The delta-sigma data converter of claim 15, wherein the loop filter, the quantizer, and the feed-back loop define a feed-forward delta-sigma data converter topology.

17. An incremental analog to digital converter comprising:
a feed-forward delta-sigma modulator including an input summer for summing an analog input signal with a feed-back signal, a loop filter including a plurality of integrators, a quantizer for quantizing a weighted sum of outputs of each of the integrator stages, and a feed-back loop including a digital to analog converter for providing the feed-back signal from the quantizer to the input summer;
control circuitry for controlling conversion by the delta-sigma modulator of the analog input signal into a plurality of quantized output codes during a sequence of integration cycles defining each of a plurality of conversion periods, wherein the control circuitry maintains stability of the modulator by holding in reset at least one of the integrator stages during a selected number of integration cycles at the start of each conversion period; and
accumulator circuitry for accumulating at least some of the output codes generated by the delta-sigma modulator during each conversion period to generate a digital output word.

18. The incremental analog to digital converter of claim 17, wherein the control circuitry maintains each of the plurality of integrator stages in reset for at least one integration cycle and sequentially releases each of the integrator stages from reset over a selected number of integration cycles to sequentially increase the order of the delta-sigma modulator at the start of each conversion period.

19. The incremental analog to digital converter of claim 18, wherein the accumulator circuitry accumulates output codes generated by the delta-sigma modulator after at least one of the plurality of integrator stages has been released from reset.

20. The incremental analog to digital converter of claim 18, further comprising a weighted feed-forward path for providing an input signal from the input of the delta-sigma modulator to the quantizer during reset of all of the integrator stages.

* * * * *